United States Patent [19]

Hadady

[11] Patent Number: 5,798,718
[45] Date of Patent: Aug. 25, 1998

[54] SLIDING WINDOW DATA COMPRESSION METHOD AND APPARATUS

[75] Inventor: Craig Eric Hadady, Lexington, Ky.

[73] Assignee: Lexmark International, Inc., Lexington, Ky.

[21] Appl. No.: 854,716

[22] Filed: May 12, 1997

[51] Int. Cl.⁶ .................................................. H03M 7/34
[52] U.S. Cl. ........................ 341/51; 341/55; 341/67; 341/87; 341/106
[58] Field of Search ................. 341/51, 55, 67, 341/87, 106

[56] References Cited

U.S. PATENT DOCUMENTS

| | | | |
|---|---|---|---|
| 3,237,170 | 2/1966 | Blasbalg et al. | 340/172.3 |
| 3,739,085 | 6/1973 | Rosen et al. | 178/6 |
| 4,464,650 | 8/1984 | Eastman et al. | 340/347 DD |
| 4,494,108 | 1/1985 | Langdon, Jr. et al. | 340/347 DD |
| 4,586,027 | 4/1986 | Tsukiyama et al. | 340/347 DD |
| 4,626,829 | 12/1986 | Hauck | 340/347 DD |
| 4,701,745 | 10/1987 | Waterworth | 340/347 DD |
| 4,872,009 | 10/1989 | Tsukiyama et al. | 341/95 |
| 4,876,541 | 10/1989 | Storer | 341/51 |
| 4,906,991 | 3/1990 | Fiala et al. | 341/51 |
| 4,955,066 | 9/1990 | Notenboom | 382/56 |
| 4,971,407 | 11/1990 | Hoffman | 341/87 |
| 4,988,998 | 1/1991 | O'Brien | 341/55 |
| 5,001,478 | 3/1991 | Nagy | 341/67 |
| 5,003,307 | 3/1991 | Whiting et al. | 341/51 |
| 5,016,009 | 5/1991 | Whiting et al. | 341/67 |
| 5,049,880 | 9/1991 | Stevens | 341/63 |
| 5,049,881 | 9/1991 | Gibson et al. | 341/95 |
| 5,051,745 | 9/1991 | Katz | 341/51 |
| 5,126,739 | 6/1992 | Whiting et al. | 341/106 |
| 5,140,321 | 8/1992 | Jung | 341/55 |
| 5,155,484 | 10/1992 | Chambers, IV | 341/55 |
| 5,227,788 | 7/1993 | Johnston et al. | 341/63 |
| 5,260,693 | 11/1993 | Horsley | 341/67 |
| 5,293,623 | 3/1994 | Froniewski et al. | 395/425 |
| 5,371,499 | 12/1994 | Graybill et al. | 341/51 |
| 5,379,036 | 1/1995 | Storer | 341/51 |
| 5,463,390 | 10/1995 | Whiting et al. | 341/51 |
| 5,473,326 | 12/1995 | Harrington et al. | 341/51 |
| 5,502,439 | 3/1996 | Berlin | 341/51 |
| 5,506,580 | 4/1996 | Whiting et al. | 341/51 |
| 5,521,597 | 5/1996 | Dimitri | 341/51 |
| 5,563,595 | 10/1996 | Strohacker | 341/106 |
| 5,572,206 | 11/1996 | Miller et al. | 341/51 |
| 5,586,294 | 12/1996 | Goodwin et al. | 395/464 |
| 5,659,713 | 8/1997 | Goodwin et al. | 395/484 |

OTHER PUBLICATIONS

The Art of Computer Programming, vol. 3 "Sorting and Searching", pp. 506–508, Knuth, ISBN: 0–201–03803–X.
Understanding Computer Programming, pp. 7–28–7–31, Radio Shack, Part No. 62–1383, Published by Texas Instruments Learning Center.
The Data Compression Book, 1992, pp. 219–311, Nelson, Mark, M & T Books, ISBN: 1–55851–214–4.

*Primary Examiner*—Richard T. Elms
*Assistant Examiner*—Kim N. Huynh

[57] ABSTRACT

A method for compressing a data stream, where a first portion of the data stream is read into a window having a history buffer and look-ahead buffer. An index, based on a fourth portion of the data stream in the look-ahead buffer is used to select an entry in a pointer array. An initial entry in a record array is selected based on the pointer array entry. A third portion of the data stream is selected. The third portion is compared to a second portion in the look-ahead buffer. If the third portion does not match the second portion, then a subsequent entry in the record array is selected, and the is designated as the initial entry. These steps are repeated until either the third portion matches the second portion, or no more entries are left in the record array. When there are no more entries left in the record array, the second portion is written to the output file, and the first portion read into the window is incremented by a predetermined amount. When the third portion matches the second portion, the history buffer address of the third portion and a length value, representing how many bytes of the third portion and the second portion matched, are output to the output file, and the first portion read into the window is incremented by the number of bytes matched.

2 Claims, 4 Drawing Sheets

30

SLIDING WINDOW DATA COMPRESSION METHOD AND APPARATUS

FIELD OF THE INVENTION

This invention relates to the field of information communication and storage. More particularly the invention relates to compressing digitized information to reduce the size of the memory required to store the information.

BACKGROUND OF THE INVENTION

Data compression is used to reduce the number of characters required to represent a given piece of information, such as a digitized data stream. By reducing the number of characters used, the data stream may be stored in a smaller amount of memory, or transmitted more efficiently, such as in a shorter length of time or using less bandwidth. Any one or more of several different methods may be use to compress data.

Two important considerations in selecting a data compression method are the degree to which the data is compressed and the speed at which the compression takes place. By degree of compression it is meant the amount of reduction in the number of characters used to represent the data. If the number of characters is only slightly reduced, then the data compression has not been as beneficial as when the number of characters is greatly reduced. Similarly, a compression method which requires a relatively greater amount of time to compress the data may not be as beneficial as a method which requires a relatively lesser amount of time. Therefore, data compression methods which greatly reduce the number of characters required to represent the data, and which operate in a small amount of time are generally preferred.

What is needed then is a method and apparatus for data compression which has a high degree of compression and reduces the amount of time required to compress the data.

SUMMARY OF THE INVENTION

The above and other needs are met by a method for compressing a data stream. A first portion of the data stream is read into a window, which has a history buffer and look-ahead buffer. An index is selected, taken from a fourth portion of the data stream in the look-ahead buffer, and based on this index, an entry in a pointer array is selected. An initial entry in a record array is selected based on the pointer array entry. The record array initial entry has a history buffer address and record array address. A third portion of the data stream is selected, starting at an address in the history buffer referenced by the history buffer address of the initial entry. The third portion of the data stream is compared to a second portion of the data stream in the look-ahead buffer. If the third portion of the data stream does not match the second portion of the data stream, then a subsequent entry in the record array is selected, based on the record array address of the initial entry, and the subsequent entry is then designated as the initial entry.

The steps from selecting the third portion through selecting a subsequent entry are repeated until either the third portion of the data stream matches the second portion of the data stream, or no more entries are left in the record array. In the case when there are no more entries left in the record array, the second portion of the data stream is written to the output file, and the first portion of the data stream read into the window is incremented by a predetermined amount. In the case when the third portion of the data stream matches the second portion of the data stream, the history buffer address of the third portion of the data stream and a length value, representing how many bytes of the third portion of the data stream and the second portion of the data stream matched, are output to the output file, and the first portion of the data stream read into the window is incremented by the number of bytes matched. The steps of the method from the step of selecting an index are repeated until all of the data stream has been read into the window.

BRIEF DESCRIPTION OF THE DRAWINGS

Further advantages of the invention will become apparent by reference to the detailed description of preferred embodiments when considered in conjunction with the following drawings, which are not to scale so as to better show the detail, in which like reference numerals denote like elements throughout the several views, and wherein.

DETAILED DESCRIPTION OF THE INVENTION

Figure 1:
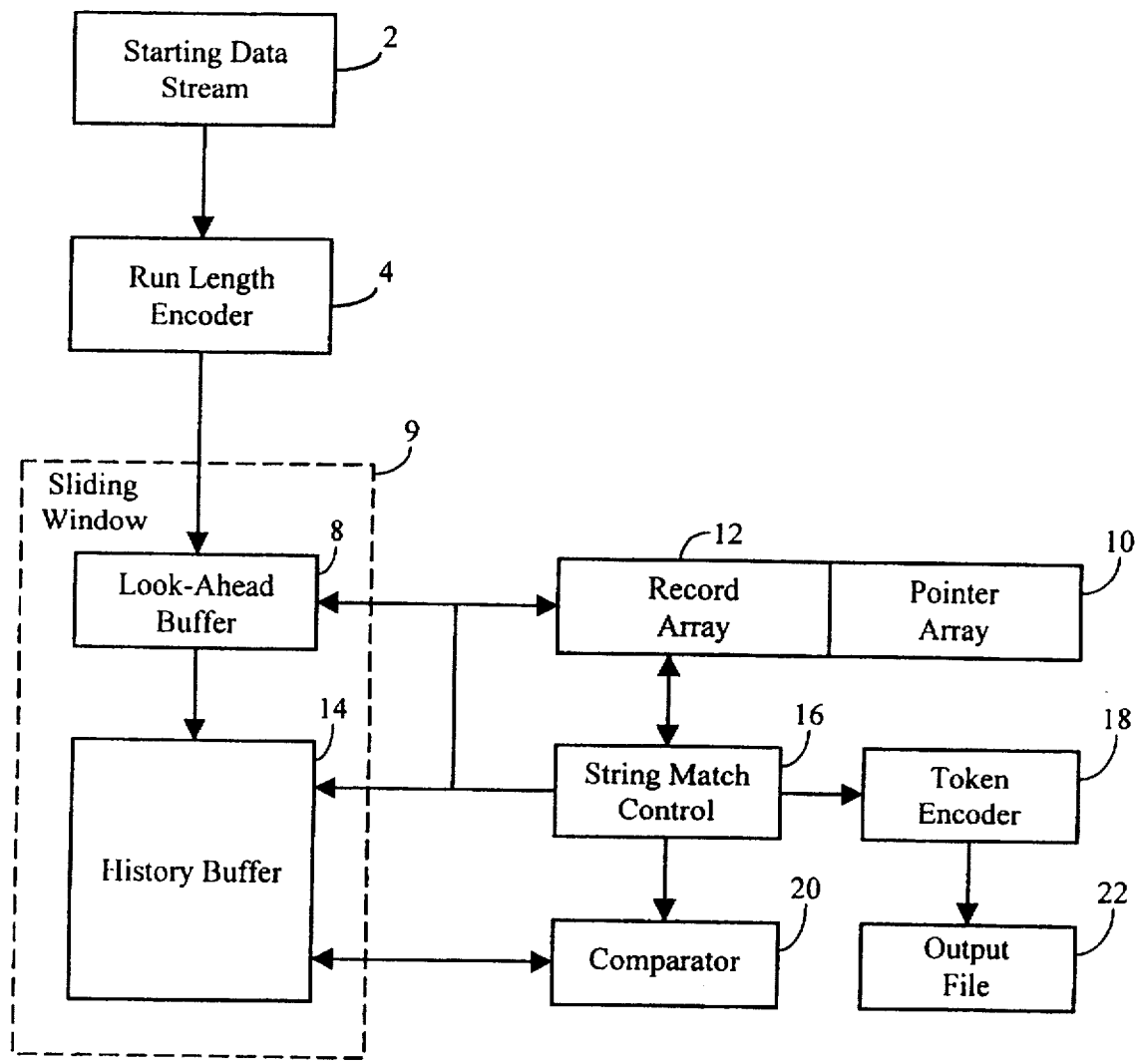
FIG. 1 is a functional block diagram of an embodiment of the compression apparatus.

In its basic form, digital data is a typically represented by a stream of zeros and ones. Each zero and each one is called a bit. Groupings of the zeros and ones, called bytes, can represent different characters, such as letters and numbers. A byte may be comprised of a different number of bits, depending on the hardware on which the method is implemented. A functional block diagram of the preferred compression apparatus is given in FIG. 1.

Preferably, the compression begins by converting the starting data stream 2 with bit-wise run length encoding 4. This is done by counting the number of consecutive zeros or ones in a run within the stream 2, and writing these run length numbers to an output file. For example, Table 1 shows an input data stream of 32 bits.

TABLE 1

| Input data stream. |
| --- |
| 00001100111110000011101010000111 |

In the preferred embodiment, the first run length number written to the output file is always the number of initial zeros. In the example depicted in Table 1, the number of initial zeros is 4. Thus, the number 4 is first written to the output file. It will be appreciated that the output file will preferably be a digital file also, and so a bit pattern of ones and zeros which represents the number 4 will be that which is written to the output file. This will preferably be the case for all the numbers described as being written in this discussion. Had the first character in the input data stream been a one instead of a zero, then a value of 0 would have been written to the output file, indicating that no zeros were present at the beginning of the input data stream.

After the number of initial zeros is written to the output file, then the number of ones following the initial run of zeros is written to the output file. In the example depicted in Table 1, the number of ones following the initial run of zeros is 2. Thus, 2 is written to the output file. Following the manner described above, the run length number of zeros and ones is written to the output file in an alternating fashion. If the length of a run of zeros or ones exceeds 254, then a value of 255 is written to the output file, the remainder of the run is counted, and this remainder value is then written to the output file as well. For very long runs, there may be several values of 255 written into the output file before the remainder value is written in. Thus, when decompressing the output file, the decompression routine preferably recognizes that a value of 255 indicates that the next following value should be added to the value of 255 to achieve the actual run length value.

It will be appreciated that this method is equally applicable to input data streams of greater and lesser length than 32 bits, which length has been chosen for the sake of convenience in describing the method. When all of the zeros and ones of the input stream depicted in Table 1 have been processed by the bit-wise run length encoding 4, an output file as depicted in Table 2 will have been created.

TABLE 2

| Output file. |
| --- |
| 4,2,2,5,5,3,1,1,1,1,4,3, |

Run length encoding 4 typically reduces the length of the input data stream by some amount, but is not an efficient method of compression for all data stream types. For example, if the input data stream had very few runs of more than one consecutive zero or one, then the output file would not be significantly smaller than the input data stream, and the time required to process the input data stream may not be worth the degree of compression achieved. Thus, in the preferred embodiment, run length encoding 4 is a selectable optional first step in the data compression method and apparatus. The output file from the run length encoding 4 will be considered as the input data stream for the rest of the compression operation described hereafter, for those cases in which the run length encoding 4 is used.

The input data stream is then compressed with a modified sliding window method. In essence, this method compresses the input data stream by looking for repeated identical runs of characters within the data stream. In the example of bit-wise run length encoding 4, the example was drawn to an input data stream represented by ones and zeros. While the input data stream of the sliding window stage of the data compression is also preferably ones and zeros, these ones and zeros can be represented by other characters, which enable the method to be more readily understood.

Preferably, the input data stream is read into a sliding window 9 having two portions, a history buffer 14 and a look-ahead buffer 8. In the preferred embodiment the size of the history buffer 14 is 512 bytes and the size of the look-ahead buffer 8 is 277 bytes. However, in alternate embodiments, other values for the sizes of the history buffer 14 and look-ahead buffer 8 can be selected.

The window 9 is designated as a sliding window because the input data stream will often contain more characters than can be held at one time in the window 9. Thus, only a first portion of the input data stream is processed at a time, and as a preceding first portion is processed and written to the output file 22, a succeeding portion of the input data stream is read into the window 19. This succeeding portion of the input data stream is then designated as the first portion of the data stream, and the processing continues in this manner until preferably all of the input data stream has been so processed. While the terminology as used herein describes the input data stream as being read into the sliding window 9, it will be appreciated that this is descriptive language, and the actual implementation of the method may be done in one or more of several different ways. For example, in the preferred embodiment, the input data stream is held in whole or in part in a memory, and pointers are used to define which portions of the data stream are currently located within the history buffer 14 or the look-ahead buffer 18.

To process the first portion of the data stream, a portion of the data stream currently residing in the look-ahead buffer 8 is compared to a portion of the data stream currently residing in the history buffer 14. The portion of the data stream being compared from the look-ahead buffer 8 will be designated the second portion, and the portion of the data stream being compared from the history buffer 14 will be designated the third portion. If a match is found between the second portion and the third portion, then two values are written as a pair to the output data file 22. The first value represents the address of the start of the third portion of the data stream in the history buffer 14, and the second value represents the length of the second portion that matched the third portion. The input data stream is then incremented through the sliding window 9 by the number of characters of the second value, which is the number of characters for which a match was found. For example, consider the data stream given in Table 3, which represents the first portion of the data stream within a sliding window 9. For the sake of example, a window size of only 20 characters will be used.

TABLE 3

| Input data stream in 20 character sliding window. |
| --- |
| 000000000111111 11112 |
| 123456789012345 67890 |
| ABCDEFGHIJKLMNO PGHOL |
| History buffer ^ Look-ahead buffer |

The carat located beneath a break in the data stream represents the division between the history buffer 14 and the look-ahead buffer 8. It will be appreciated that the input data stream does not necessarily need to be physically divided between the history buffer 14 and the look-ahead buffer 8, but a pointer or other such device may be used to track which portion of the data stream is in the history buffer 14 and which portion of the data stream is in the look-ahead buffer 8. The values listed above the alphabetical data of the data stream represent addresses, as will be discussed more fully hereafter. Preferably, the window 9 slides along the data stream as the data stream is processed, such that the new portions of the data stream which have not yet been processed enter the look-ahead buffer 8 first, and then are incremented through the history buffer 14, until they exit the sliding window 9 out of the history buffer 14 end of the window 9.

Consider that the second portion of the data stream in the look-ahead buffer 8 starts with the character F. It is desired to find a third portion of the data stream within the history buffer 14 which matches the second portion in the look-ahead buffer 8. Several different portions of the data stream within the history buffer 8 may be compared to the second portion before a match is found. For example, the start of the second portion, the character F, may be compared with the first character in the history buffer 14, A, which would be designated as the third portion. Of course, these characters do not match, and so a subsequent portion of the data stream in the history buffer 14 would be selected as the third portion of the data stream to be compared to the second portion. For example, the next third portion could start with the next character in the history buffer 14, the character B. This also does not match the second portion of the data stream, and so a subsequent third portion would be selected.

The method by which the initial and subsequent third portions of the data stream in the history buffer 14 are selected can greatly reduce the amount of time required to find a match. For example, the initial third portion may always be selected by starting with the first character in the history buffer 14, and then subsequent third portions may be selected by serially advancing one character at a time through the history buffer 14 until either a match is found or the end of the history buffer 14 is reached. However, it may be more efficient to select the initial and subsequent third portions by creating an index of some sort. This topic will be considered in more detail later in the discussion.

Regardless of the method by which the initial and subsequent third portions are found, when a match is found between the third portion and the second portion, the address for the start of the matching third portion is recorded. This address preferably takes the form of an offset value from the start of the history buffer 14. In the example depicted in Table 3, the address of the matching F in the history buffer 14 is 6. This address, 6, becomes the first value of an output pair written to the output file 22. The next value to be written is the length of the third portion which matches the second portion. In the example depicted, the second portion of FGH matches the third portion of FGH, and so a value of 3, representing three matching characters in the third and second portions, is written as the second value of the output pair in the output file 22.

It will be appreciated that there may be more than one third portion in the history buffer 14 which matches the second portion in the look-ahead buffer 8. In such an event, a method must be employed to decide which of the matching third portions is the best match. Preferably, that third portion which matches the greatest number of characters of the second portion would be considered the best match, as a greater portion of the input data stream is processed in this step by such a decision. If two or more third portions all match the same number of characters of the second portion, then, in the preferred embodiment, the best match is that third portion which has the smallest address in terms of characters required to indicate the address. In this manner, the output file 22 can be kept as small as possible. In the examples shown in the Tables, the address for the third portion has been calculated as an offset from the start of the history buffer 14. However, it will be appreciated that other address schemes may be employed in alternate embodiments, such as calculating an offset from the other end of the history buffer 14, nearest the look-ahead buffer 8.

When a match is found in this manner, the input data stream is incremented through the sliding window 9 by the same number of characters as the second value written to the output file 22, being the length of the match between the third and second portions. Thus, this same number of characters of the input data stream will be incremented out of the history buffer 14 at one end of the sliding window 9, and this same number of characters of the input data stream will be incremented into the look-ahead buffer 8 at the other end of the sliding window 9. For the example given above, the second value is 3, and so after having incremented the data stream through the window 9, the window 9 would then hold the data stream as depicted in Table 4.

TABLE 4

| Input data stream in 20 character sliding window. |
| --- |
| 000000000111111 11112 |
| 123456789012345 678980 |
| DEFGHIJKLMNOFGH OLABD |
| History buffer ^ Look-ahead buffer |

This incremented portion of the input data stream residing in the window 9 becomes the new first portion of the data stream being processed. The new second portion of the data stream in the look-ahead buffer 8 starts with the letter O. The offset address numbers retain their positions, and the process of finding a match between the second portion and initial or subsequent third portions begins anew. In this example, the second portion matches a third portion in this history buffer 14 which starts at address 12, and runs for a length of 1 character. Thus, the first two pairs written to the output file 22 for the matches found as depicted in Tables 3 and 4 would be as given in Table 5.

TABLE 5

| Output file. |
| --- |
| 6,3,12,1 |

It will be appreciated that the order of writing the values into the output file 22 may be reversed, such that the length may be the first value written and the address may be the second value written. The values written to the output file 22, such as the address and the length values, may be written to the output file 22 as depicted in Table 5, but are preferably written using different schemes, which schemes are selected to reduce the size of the output file 22. For example, either the address or the length value may be tokenized instead of being written as an actual value. Preferably, the user may select one of two different output file encoding methods, either a static encoding method or a dynamic encoding method.

In the static encoding method, one or both of the length and address values are mapped to a particular fixed bit sequence. In the preferred embodiment of this method, only the length is so tokenized, and the address is written into a fixed-length nine bit field. The length value is encoded in a token encoder 18 by looking up the value of the length in a predefined table which correlates the length value to a token character. The token character is preferably shorter in length than the value of the length, and preferably, those length values which occur most frequently are assigned the shortest tokens, so that the output file 22 may be as small as possible. If there is no match found, or the match length is one, the token encoder 18 emits a binary zero, followed by the non-matching byte. For 8 bit bytes, this would be a total of nine bits. When the output file 22 is decoded, the decoder runs the length token through the predefined table again, and gets the length value back.

If a match length greater than one is found, then in the preferred embodiment, the token table give in Table 6 is used:

TABLE 6

Static tokenizing table.

| Match length | Length Code | Displacement Code |
|---|---|---|
| 2–3 | 10x | 9-bit code |
| 4–7 | 1110xx | 9-bit code |
| 8–15 | 1110xxx | 9-bit code |
| 16–31 | 111109xxxx | 9-bit code |
| 32–277 | 11111xxxxxxxx | 9-bit code |

The 9-bit displacement code is preferably calculated as follows:

```
temp = (address of first byte in look-ahead buffer) –
       (match-position-address) – 1
if (temp <0)
  then (displacement code) = temp + 796
  else (displacement code) = temp
``` where the addresses are the addresses of the history buffer 14.

The X's for the length code are coded with the offset of the given length in the code range. For example, for the range of 8–15, a string length of 12 would be coded as 1110100, an offset of 4 into the range. The final token is the length code followed by the displacement code. When the compressor finishes a compression cycle, a special end-of-file token, preferably 1111111111111, is written to the output file 22. This marks the end of the output file 22.

The dynamic encoding method works according to the same basic principle as the static encoding method, except that the table by which the length value is encoded is not a static predefined table that doesn't change as the data stream is processed, but is a dynamic table which changes based on the particular characteristics of the data stream being processed. In this method, the frequency of occurrence of different length values is monitored, and as the frequency of a given length value increases, it is assigned a shorter token in the table than those length values having lesser frequencies of occurrence. Preferably, a predefined rule set is used to make these table assignment decisions, and the rule set is provided to both the compressor and decompressor apparatuses, so that the decompressor will make table changes at the same point in processing the output file 22 as the compressor made in writing the output file 22, and the output file 22 will be fully reconstructed to the starting data stream 2 by the decompressor. By using the dynamic table, those length values which occur most frequently are assigned the smallest token values, even when the frequency of occurrence changes through the compression of the data stream.

For example, in the preferred embodiment the second encoding method initially uses the above encoding method to generate the output tokens. As tokens are generated, logic circuitry keeps track of how many of each token type are generated. If the frequency of a given token type exceeds a token type coded with fewer length code bits, this higher-frequency token type adopts the length code of the type with fewer length code bits. Consider the tokenizing table given in Table 7.

TABLE 7

Dynamic encoding table in initial configuration.

| Type | Match length | Length Code | Displacement Code |
|---|---|---|---|
| A | 2 | 100 | 9-bit code |
| B | 3 | 101 | 9-bit code |
| C | 4–7 | 1110xx | 9-bit code |
| D | 8–15 | 1110xxx | 9-bit code |
| E | 16–31 | 11110xxxx | 9-bit code |
| F | 32–277 | 11111xxxxxxxx | 9-bit code |

For example, if the number of type E tokens exceeds the number of type D tokens during a compression job, future type E and D tokens will be coded as given in Table 8:

TABLE 8

Dynamic encoding table after reconfiguration.

| Type | Match length | Length Code | Displacement Code |
|---|---|---|---|
| D | 8–15 | 11110xxx | 9-bit code |
| E | 16–31 | 1110xxxx | 9-bit code |

Specific embodiments of tokens which may be used have been given above. However, it will be appreciated that these tokens are examples of those which may be used in a preferred embodiment. Of course, it is possible to use other tokens within the broader concept of tokens being used to encode the length data and the displacement, and a dynamic scheme in which the encoding may change when there are benefits to doing so.

In the preferred embodiment, the compression method runs in a concurrent manner, such that several different steps of the method may occur simultaneously. For example, by providing more than one comparator 20, which compares the third and second portions, more than one third portion at a time may be compared, and the match may thus be found more quickly. In the preferred embodiment four comparators 20 are used.

If no third portion exists which matches the second portion in the look-ahead buffer 8, then the data stream is incremented through the window 9 by a certain number of characters. Those characters which are incremented from the look-ahead buffer 8 to the history buffer 14 are written into the output file 22, and the process of attempting to match the new second portion to an initial or subsequent third portion is repeated. In the preferred embodiment, the data stream is only incremented by a single character, and so that single character is written to the output file 22 as described above, and is incremented from the look-ahead buffer 8 to the history buffer 14.

As was mentioned above, the compression apparatus may operate more quickly on a data stream by using a different method than serially stepping through the history buffer 14 for finding candidate third portions of the data stream. Preferably, an apparatus having two arrays is used to more quickly identify third portions in the history buffer 14 which are likely candidates to match the second portion in the look-ahead buffer 8. The two arrays are designated as the pointer array 10 and the record array 12.

As an overview, as the first portion of the data stream is read into the window 9, a fourth portion of the data stream is used to create an index, which is used to select an entry in the pointer array 10. The entry in the pointer array 10 is then used to select an initial entry in the record array 12. The initial entry in the record array 12 contains an address in the history buffer 14 for an initial third portion of the data stream which is a likely match for the second portion of the data stream. The initial entry in the record array 12 also has a record array address, which points to a subsequent entry in the record array 12, which subsequent entry also contains a history buffer address for a subsequent third portion of the data stream which is a likely candidate for matching the second portion of the data stream. If the third portion referenced by the initial entry does not provide an adequate match to the second portion, or if it is desired to compare more third portions, then subsequent entries will be used. In this manner, a more efficient and targeted method of locating likely matches is provided.

The number of subsequent record array entries accessed preferably depends on a balance of several criteria. For example, if the end of the record array 12 is reached, then the process of selecting subsequent record array entries may stop. Also, if the history buffer address in the record array entry points to a third portion which matches the second portion, and the length of the match is equal to or greater than a predetermined value, then the subsequent record array entries may not be investigated. Further, only a predetermined number of record array entries may be investigated, and at that point whichever third portion that has already been found to match, and having the greatest match length, is used as the matching third portion. In this manner the preferred apparatus ensures that too great a length of time is not spent on searching for matching third portions.

In order for the pointer array 10 and the record array 12 to be useful, they must be loaded with data and then maintained during the operation of the compression apparatus. An overview of this process in given in FIG. 3. To load the arrays, the data stream is incrementally read into the window 9 one byte at a time until the look-ahead buffer 8, which fills first, is full, and there is one byte of the data stream in the history buffer 14. At this point, a fifth portion of the data stream, being in the preferred embodiment the lower 4 bits of the byte which has just moved into the history buffer 14 and the lower 4 bits of the first byte in the look-ahead buffer 8 (which is the next byte to be incremented into the history buffer 14) is concatenated as depicted at S102 in FIG. 3. This newly formed 8 bit byte is a pointer used to look up an entry in the pointer array 10. Thus, there is a relationship between the size of the pointer array 10 and the number of bits used to form the pointer. Eight bits of digital information have 256 unique values, which is the size of the pointer array 10. Thus, in alternate embodiments, other pointer array sizes can be chosen, with a commensurate different number of bits used to create the pointer.

In the preferred embodiment, the record array 12 has a length of 512 entries. Therefore 9 bits are required to point to an entry in the record array 12. As has been mentioned, the history buffer 14 also has a preferable size of 512 bytes, and so 9 bits are also required to address all the bytes in the history buffer 14. Other values for the size of record array 12 and history buffer 14 may also be chosen, which would require a commensurately different number of address bits to completely address them.

Figure 2:
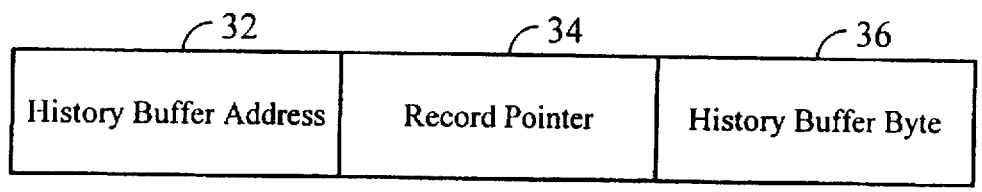
FIG. 2 depicts one method of concatenation to form a record array entry.
Figure 3:
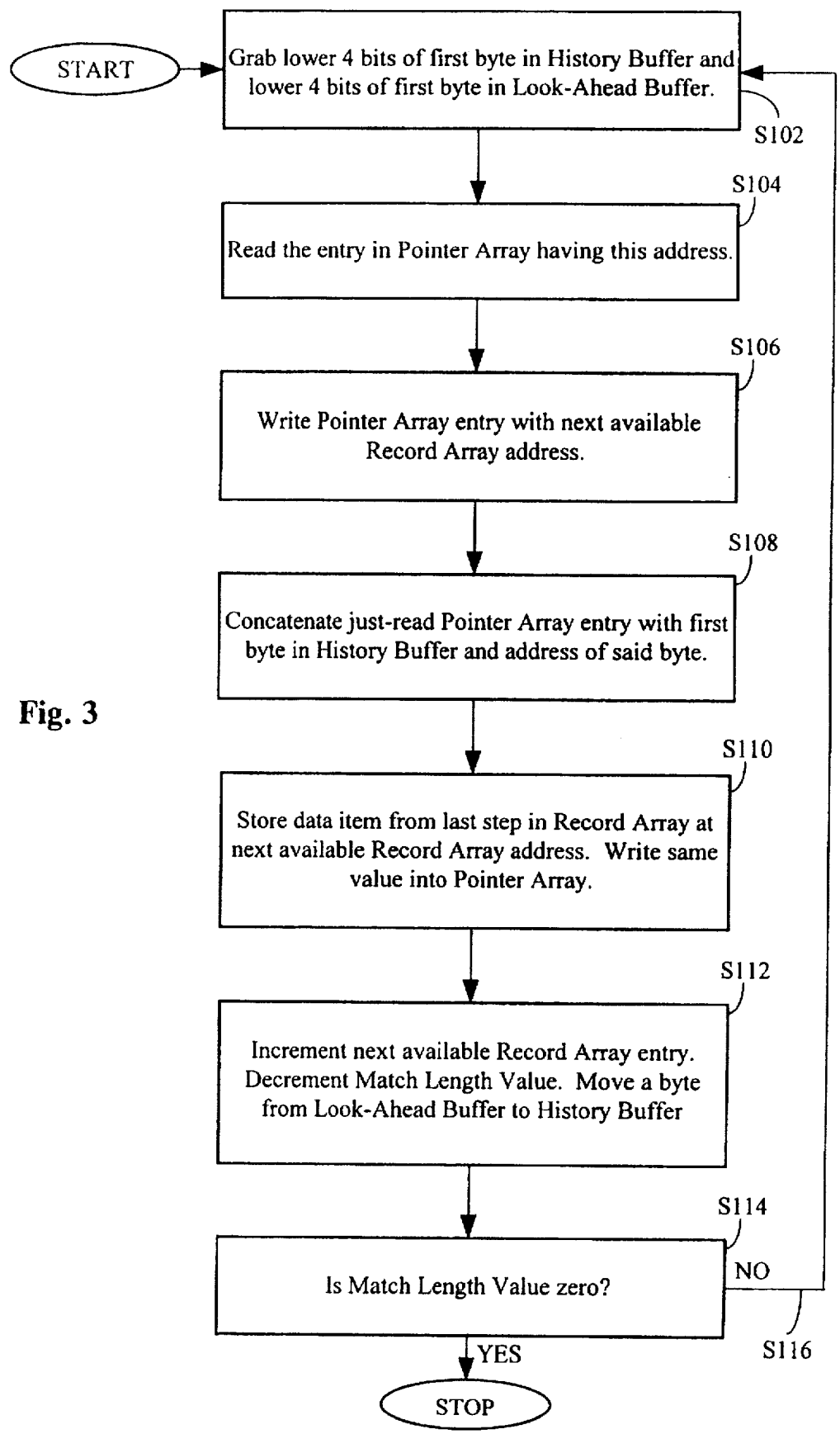
FIG. 3 is a flow chart of an embodiment of the method for updating the pointer array and record array.

As depicted at S104 in FIG. 3, the entry in the pointer array 10 referenced by the pointer is read and saved temporarily, and its place in the pointer array 10 is overwritten with the address of the next available entry in the record array 12 as depicted at S106 in FIG. 3. For the very first cycle, this is the first entry in the record array 12, for the second cycle it is the second entry, and so on. The next available record address is preferably implemented with a 9-bit counter, and is initialized to zero when the compressor apparatus is started. Default start-up values in the record array 12 indicate invalid record entries, as all entries are invalid after an initial start or reset. As depicted at S108 in FIG. 3, the entry 34 from the pointer array 10 that was temporarily saved is concatenated with the current address 32 of the first byte in the history buffer 14, and the byte 36 contained in the first address of the history buffer 14, and, as depicted at S110 in FIG. 3, written into the record array entry referenced by the address of the next available entry in the record array 12 as written into the pointer array 10 above. A depiction of a preferred embodiment of the concatenated record array entry 30 is given in FIG. 2.

At this point the value of the next available entry in the record array 12 is incremented by one, and the next byte of the data stream is incremented from the look-ahead buffer 8 to the history buffer 14 as depicted at S112 in FIG. 3, and the process of forming an 8 bit index into the pointer array 10, and loading the pointer array 10 and record array 12 is cyclically repeated, as depicted at S114 and S116 in FIG. 3. This process is preferably used to update the pointer array 10 and the record array 12 whenever the data stream is incremented through the window 9, and is done as each byte of the data stream is incremented from the look-ahead buffer 8 to the history buffer 14.

In the preferred embodiment, the purpose of loading and updating the pointer array 10 and the record array 12 in this manner is so they can be used to provide likely candidates for a match between the second portion of the data stream in the look-ahead buffer 8 and third portions of the data stream in the history buffer 14. Thus, whenever the data stream is incremented through the window 9, by either one byte if no previous match was found or by the number of bytes of the length of the previous match, and a new byte of the data stream enters the history buffer 14, a method of finding the likely third-portion candidates is preferably used. A flow chart for the preferred method of using the pointer array 10 and record array 12 is given in FIG. 4.

Figure 4:
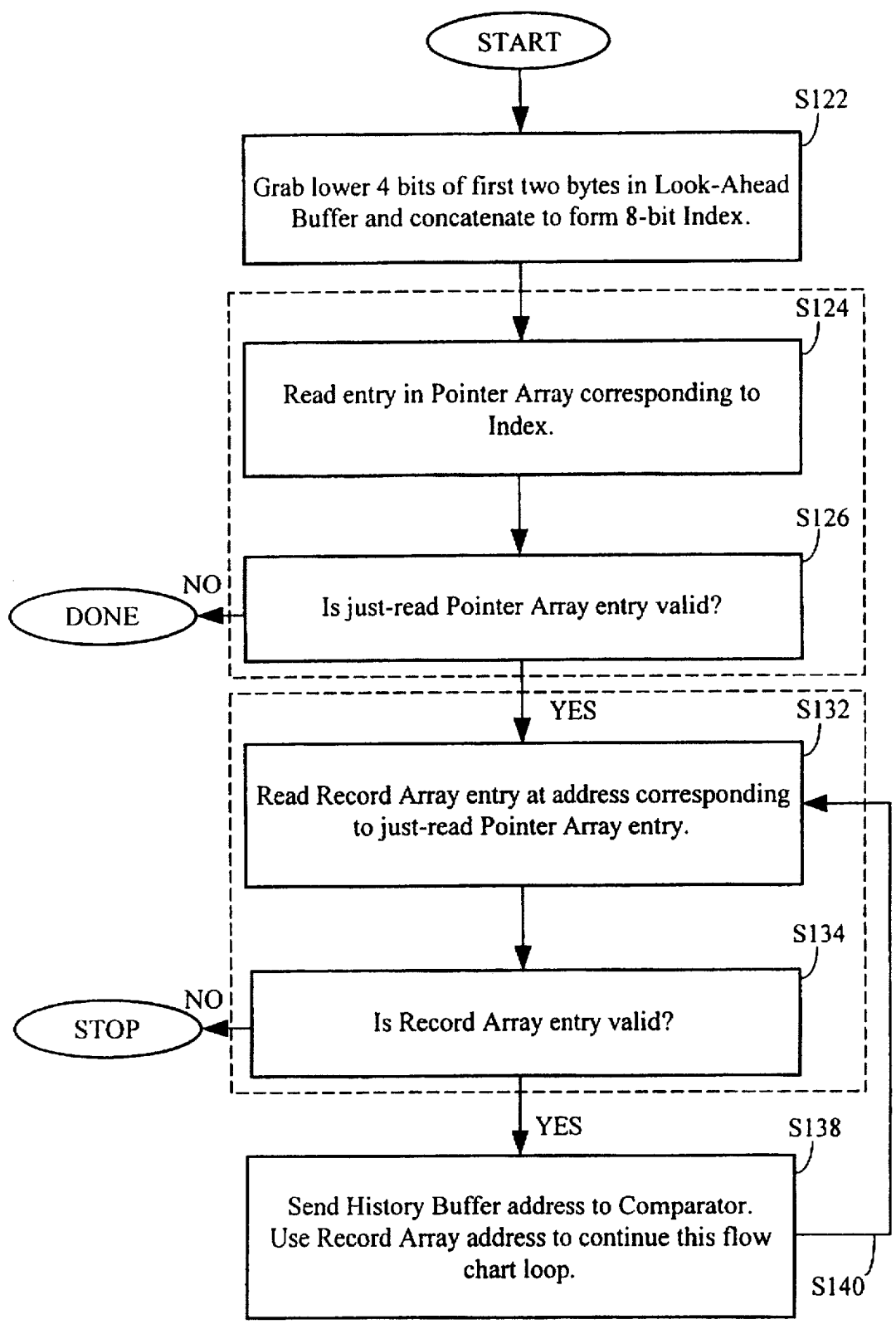
FIG. 4 is a flow chart of an embodiment for using the pointer array and record array to select third portions of the data stream.

First, as depicted at S122 in FIG. 4, the lower 4 bits from each byte of the fourth portion of the data stream, being preferably the first two bytes in the look-ahead buffer 8 (which are the next two bytes to be incremented into the history buffer 14), are concatenated into an 8 bit index, which is used to reference an entry in the pointer array 10. While a different number of bits may be used from each of the two bytes, and a different number of bytes may be used, there is a benefit from using this method in the preferred embodiment. Many data streams will produce values of not more than 16 when processed with a run length encoder 4. This means that typically a data stream does not have runs of zeros or ones that are greater than 16 characters in length. Thus, most of the differentiating information from the run length encoder 4 will be contained in the lower four bits of the byte. Therefore, these are the bits that are used to load the pointer array 10, and create the index for reading the pointer array 10. In an alternate embodiment, five bits from each byte could be used. In this embodiment, the size of the pointer array 10 would preferably be 1024 entries, which is the number of entries that can be addressed by ten bits.

As depicted at S124 and S126 in FIG. 4, the entry in the pointer array 10 referenced by the index is read and checked for validity. An invalid pointer array entry is one that contains the default value written into the pointer array 10 when the compression method is started or reset. If the pointer array entry contains an invalid value, then no third-portion matching candidates exist, and this portion of the process is done. At this time, the compression routine writes the first byte in the look-ahead buffer 8 into the output file 22, increments the data stream by one byte through the window 9, and creates a new index as depicted at S122.

If the entry in the pointer array 10 referenced by the index is valid, then it is an address in the record array 12, which is selected based on the entry in the pointer array 10 as depicted at S132 in FIG. 4. This is the initial record array entry. The selected entry in the record array 12 contains the concatenation of a history buffer address, another record array address, and a byte previously read from the history buffer 14, all as described above. The byte from the history buffer 14 serves as a validity check as depicted at S134 in FIG. 4. If this byte does not match the first byte of the look-ahead buffer 8, then the record array entry is invalid, which indicates that there are no more third-portion candidates to be checked for matching.

If the initial record array entry is valid, then the history buffer address in this entry references a candidate third portion in the history buffer 14. As depicted at S138 in FIG. 4, this address is passed off to a comparator unit 20, which looks up the third portion in the history buffer 14, and compares it for a match to the second portion in the look-ahead buffer 8. If a match is found, then the length of that match is also determined by the comparator unit 20.

The initial record array entry also contains an address to a subsequent entry in the record array 12. As depicted at S138, S140, and S134 in FIG. 4, this subsequent entry is also checked for validity, and if valid, the subsequent third portion in the history buffer 14 referenced by this subsequent entry's history buffer address is also checked for a match to the second portion by a comparator 20. This subsequent entry may then be designated as the initial entry, and the process of finding more subsequent entries in the record array 12 continues. This process of finding additional entries, and comparing additional third portions in the history buffer 14 to the second portion in the look-ahead buffer 8 continues until at least one of several preferred criteria are met. These criteria are preferably as described above: no more valid entries in the record array 12, an adequate match has been found, or a predetermined number of entries in the record array 12 have been identified and their associated history buffer addresses have been passed off to comparator units 20. At this point, either a match has not been found, or the best match found at this point is used, and the compression method continues as described above.

When all of the input data stream has been incremented through the window 9, the compression of the data stream is completed. It will be appreciated that neither the look-ahead buffer 8 nor the history buffer 14 need to be full for the apparatus to work, but the apparatus will identify those portions of the buffer that contain valid information. This is important when, for example, the size of the file being compressed is less than the sizes of the look-ahead or history buffers. The output file 22, which may be tokenized as described above, may be decompressed by a decompressor which operates on the output file 22 using the reverse order of the selected compression routines described above.

While specific embodiments of the invention have been described with particularity above, it will be appreciated that the invention is equally applicable to different adaptations well known to those skilled in the art.

I claim:

1. A method for compressing a data stream comprising:
   a. reading a first portion of the data stream into a window, the window having a history buffer and a look-ahead buffer,
   b. selecting an index taken from a fourth portion of the data stream in the look-ahead buffer,
   c. selecting an entry in a pointer array based on the index, said pointer array including at least a portion of the entries containing the address of one of the entries in a record array,
   d. selecting an initial entry in said record array based on the pointer array entry, the record array initial entry having a history buffer address and a record array address, said record array including at least a portion of the entries containing the address for others of the record array entries and one of the history buffer addresses,
   e. selecting a third portion of the data stream starting at an address in the history buffer referenced by the history buffer address of the initial entry,
   f. comparing the third portion of the data stream to a second portion of the data stream in the look-ahead buffer,
   g. if the third portion of the data stream does not match the second portion of the data stream, then selecting a subsequent entry in the record array based on the record array address of the initial entry, the subsequent entry then being designated as the initial entry,
   h. repeating steps e. through g. until either the third portion of the data stream matches the second portion of the data stream or no more entries are left in the record array,
      i. if there are no more entries left in the record array, then writing the second portion of the data stream to the output file, and incrementing the first portion of the data stream read into the window by a predetermined amount, and
      ii. if the third portion of the data stream matches the second portion of the data stream, then outputting to the output file the history buffer address of the third portion of the data stream, and a length value representing how many bytes of the third portion of the data stream and the second portion of the data stream matched, and incrementing the first portion of the data stream read into the window by the number of bytes matched, and
   i. repeating the method from step b. until all of the data stream has been read into the window.

2. An apparatus for compressing an initial data stream comprising:
   a. a bit-wise run length preprocessor, for selectively compressing consecutive runs of zeros and ones in the initial data stream with run length encoding and producing a preprocessed data stream,
   b. a sliding window compressor for selectively reading a first portion of one of the initial and preprocessed data streams, the sliding window compressor having a history buffer having addresses and a size of 512 bytes and a look-ahead buffer having addresses and a size of 277 bytes,
   c. a record array having entries with addresses, at least a portion of the entries containing the address for others of the record array entries, one of the history buffer addresses, and a first byte from the data stream in the look-ahead buffer, d. a pointer array having entries with addresses, at least a portion of the entries containing the address of one of the entries in the record array, e. means for creating an index from a portion of the first byte and a portion of a second byte of the data stream in the look-ahead buffer, f. means for selecting and reading the entry in the pointer array having the address corresponding to the index, g. means for validating the selected pointer array entry, an invalid pointer array entry being one which does not contain the address of one of the entries in the record array, h. means for selecting and reading an initial entry in the record array having the address corresponding to the address read from the validated entry in the pointer array, i. means for validating the selected record array initial entry, an invalid record array initial entry being one which does not contain the first byte from the data stream in the look-ahead buffer, j. means for selecting a third portion of the data stream starting at the address of the history buffer contained in the validated record array initial entry, k. comparator units for comparing the third portion of the data stream to a second portion of the data stream, starting with the first byte in the look-ahead buffer, and determining if the third portion and the second portion match, and for further determining a length of the third portion and the second portion that match as expressed in a number of bytes, l. means for selecting a subsequent entry in the record array based on the record array address contained in the initial entry, the subsequent entry then being designated as the initial entry, m. means for iteratively operating elements j. through l. until meeting at least one of the conditions including the number of bytes by which the third portion matches the second portion is at least equal to a predetermined value, no more entries are left in the record array, and at least a predetermined number of record array entries have been investigated, n. means for selecting the third portion which best matches the second portion, as determined by criteria including the length and the address of the third portion, o. means for outputting to an output file the history buffer address and the length of the selected third portion, p. means for selectively tokenizing the length output to the output file using one of a static table and a dynamic table, q. the static table for tokenizing the length according to a predetermined order of the static table which does not change according to differences in the data stream, r. the dynamic table for tokenizing the length according to rules which change a predetermined order of the dynamic table according to differences in the data stream, s. means for incrementing the first portion of the data stream read into the window by a number of bytes, the number of bytes determined by the length if a match was found, and the number of bytes being one if the match was not found, until all of the data stream has been compressed, and t. means for writing a value of 1111111111111 to the output file.

* * * * *